United States Patent
Chen

(10) Patent No.: US 10,304,579 B2
(45) Date of Patent: May 28, 2019

(54) PI-ORBITAL SEMICONDUCTOR QUANTUM CELL

(71) Applicant: Bor-Ruey Chen, Taipei (TW)

(72) Inventor: Bor-Ruey Chen, Taipei (TW)

( * ) Notice: Subject to any disclaimer, the term of this patent is extended or adjusted under 35 U.S.C. 154(b) by 198 days.

(21) Appl. No.: 15/414,698

(22) Filed: Jan. 25, 2017

(65) Prior Publication Data
US 2018/0211738 A1     Jul. 26, 2018

(51) Int. Cl.
*G21H 1/06*     (2006.01)
*H01L 51/44*     (2006.01)
*H01L 51/42*     (2006.01)

(52) U.S. Cl.
CPC ........... *G21H 1/06* (2013.01); *H01L 51/4213* (2013.01); *H01L 51/441* (2013.01); *H01L 51/448* (2013.01)

(58) Field of Classification Search
CPC ...... G21H 1/106; G21H 1/06; H01L 51/4213; H01L 51/441; H01L 51/448
See application file for complete search history.

(56) References Cited

U.S. PATENT DOCUMENTS

| | | | | |
|---|---|---|---|---|
| 4,415,526 A | * | 11/1983 | Garrett | G21C 3/40 136/253 |
| 2014/0225472 A1 | * | 8/2014 | Guo | G21H 1/06 310/303 |

FOREIGN PATENT DOCUMENTS

CN     10 3730184 A     4/2014

* cited by examiner

*Primary Examiner* — Matthew L Reames
(74) *Attorney, Agent, or Firm* — Bacon & Thomas, PLLC

(57) ABSTRACT

Herein is disclosed a quantum cell from top to down including: an N-type ohmic contact electrode, an N-type π-orbital semiconductor substrate, an N-type π-orbital semiconductor epitaxy layer, a $SiO_2$ passivation layer, a graphite contact layer, a Schottky contact electrode, a binding layer, and a radioisotope layer. The N-type π-orbital semiconductor substrate includes an organic semiconductor material with an aromatic group or a semiconductor material with a carbon-carbon bond. The N-type π-orbital semiconductor epitaxy layer has a doping concentration of $1\times10^{13}$-$5\times10^{14}$ $cm^{-3}$ and is formed by injection of a cationic complex in a dose of $6\times10^{13}$-$1\times10^{15}$ $cm^{-3}$.

5 Claims, 3 Drawing Sheets

PI-ORBITAL SEMICONDUCTOR QUANTUM CELL

FIELD OF THE INVENTION

The present invention is related to a quantum cell, and more particularly to a π-orbital semiconductor quantum cell.

BACKGROUND OF THE INVENTION

A nuclear battery is also referred to as radioisotope battery. When the radioisotope decays, one neutron in the nucleus changes into one proton with one electron released. Such reaction can release energy in the form of thermal energy or radiant energy, and the released energy is greater than energy produced in a chemical reaction. The intensity of energy produced in a decay reaction and the reaction rate are not influenced by ambiance temperature, pressure, and electromagnetic fields. Therefore, a nuclear battery is of high anti-interference, accurate work, and high operating life.

A nuclear battery is classified into two types: thermal converter and non-thermal converter. In a thermal converter, thermoelectric effect or photoelectric effect occurs to generate electric energy by using a radioisotope which can generate energy massively, e.g. Pu-238, Cm-244, or Cm-242. In a non-thermal converter, energy carried by an α particle, a β particle, or a γ ray released in radioisotope decay. Taking a β particle as an example, this high energy electron beam enters a trapping layer via an electron channel. At this moment, an electron in a semiconductor material is excited into an excited state by the particle to form an electron hole and thus obtain a voltage. After an electric circuit is generated, an electric current is generated. Since this mechanism is similar to the photovoltaic effect, this type of nuclear battery using the decay as the energy source is also referred to as betavoltaic cell. With the fact that current research on the nuclear battery is not enough, nuclear energy to electric conversion efficiency of the two types of nuclear battery is low (0.1-5% for thermal converter; 6-8% for non-thermal converter).

China Invention Patent Publication CN201310516945.4 discloses a SiC Schottky junction nuclear battery, which from top to down comprises: an N-type ohmic contact electrode, an N-type SiC substrate, an N-type SiC epitaxy layer, a $SiO_2$ passivation layer, a Schottky contact metal layer, a Schottky contact electrode, a binding layer, and a radioisotope layer. The N-type SiC substrate has a doping concentration of $1 \times 10^{18}$-$7 \times 10^{18}$ $cm^{-3}$, and the N-type SiC epitaxy layer has a doping concentration of $1 \times 10^{13}$-$5 \times 10^{14}$ $cm^{-3}$ and is formed by injection of a Nb ion in a dose of $5 \times 10^{13}$-$1 \times 10^{15}$ $cm^{-3}$ under energy of 2,000-2,500 KeV.

With doping of a trace of impurity, the electric property of the semiconductor used in the foregoing patent publication may change. According to the electric property of the material, the semiconductor may be an intrinsic semiconductor or an extrinsic semiconductor. An intrinsic semiconductor is a material without any adventitious impurities, its own electric property is sourced from the material property, and its example is Si or Ge. An extrinsic semiconductor contains a considerable amount of adventitious impurities and its own electric property is not absolutely sourced from itself.

Si and Ge are a Group IV-A element, and can be linked to another element by a covalent bond. Therefore, all valence electrons in the material occupy a valence band, and the electrons can jump into the conduction band after absorbing energy more than an energy gap between them. This not only increases the free electron number to enhance electric conductivity, but also gives holes at the valence band previously occupied by the valence electrons. Each hole carries a positive charge, and can conduct electricity. Consequently, the electric conductivity of the semiconductor material results from the electrons in the conduction band and the holes at the valence band.

A dopant can modulate the electric property of a semiconductor material. After a Group V-A material is doped in a Group IV-A semiconductor material, the negative charges in the extrinsic semiconductor increase, and this type of semiconductor is called as N-type semiconductor. After a Group III-A material is doped in a Group IV-A semiconductor material, the positive charges in the extrinsic semiconductor increase, and this type of semiconductor is called as P-type semiconductor.

A semiconductor bulk has a continuous electron energy variation near Fermi level. When the particle size decreases to a certain extent, the electron energy near Fermi level is discrete not continuous. In a semiconductor nanoparticle, the electron energy variation between the highest occupied molecular orbital (HOMO) and the lowest unoccupied molecular orbital (LUMO) is discontinuous. The situation that the energy level broadens or the electron energy variation is discrete is called as quantum size effect. The semiconductor bulk has limitless atoms, and also has limitless conductible electrons. Accordingly, the energy level spacing δE approaches zero.

Radiation is energy emission from a material at a temperature above 0 K in the form of photons or particles, and this phenomenon is also called as "emission." Radiation is classified into particle radiation and photon radiation. The typical particle is an α particle, i.e. a helium nuclear, or a β particle containing a negative electron, a positive proton, and a neutral neutron. Referring to FIG. 1, the frequency of each electromagnetic wave is arranged in a serious from high to low: radio, microwave, infrared, visible, ultraviolet, X-ray, and γ ray. The latter two are high energy electromagnetic waves. All of an α particle, a β particle, and a γ ray have high energy and a low wavelength. The electron number N of a traditional semiconductor is very great, and this semiconductor requires a transition material with a very low electron number N so that the energy level spacing δE is of a certain value not zero. That is, energy level spacing fission takes place.

In 1977, Hideki Shirakawa, Alan Heeger, and Alan MacDiarmid reported that iodine-doped oxidized poly-acetylene has high electric conductivity. They are winners of 2,000 Nobel Prize in Chemistry for the innovative investigation on conductive polymers. Since the late 1980s, a π-orbital semiconductor is an important application of conductive polymers.

A π-orbital semiconductor can be used to overcome problems exhibited by the second generation electric material. In 1981, Massachusetts Institute of Technology provided the concept of π-orbital organic semiconductors. An organic compound plays an important role in the life science field, but the fact this compound has electric properties similar to those of a semiconductor material is less likely to be noticed. Although an organic compound is not a suitable conductive material, a base in this compound carries a π electron so that orbitals of the base are overlapped in an axis direction. Overlapping is considered the cause of molecular conductivity.

D. D. Eley has analyzed electric properties of various aromatic compounds. He found that the more π electrons a compound has, the less energy gap a semiconductor has. For example, a molecule having 20 π electrons has an energy gap of about 1.5±0.5 eV; a molecule having 10 π electrons has an energy gap of about 3.0±1.0 eV.

Electron jump in a π-orbital semiconductor is different from that in any traditional inorganic semiconductor. In an inorganic semiconductor, such as Si or GaAs, atoms are linked to each other by a covalent bond, and therefore electron clouds mostly overlap. This results in atomic energy level fission so as to form a valence band and a conduction band. In a traditional solid semiconductor, electrons can jump from a valence band to a conduction band, and thus its optical transition is determined by the valence band and the conduction band. In a π-orbital semiconductor, molecules are linked to each other by van der Waal's force not by a covalent bond. Compared with the covalent bond, van der Waal's force is relatively weak, so a slight overlap between electron clouds of the molecules exists. Although energy level fission occurs, the fission extent is very low. Accordingly, the energy level structure of this semiconductor is similar with that of a single molecule. Electrons still can jump between hybrid orbitals; that is, electrons can jump from the HOMO to the LUMO, further to another unoccupied molecular orbital (UMO). For a π-orbital semiconductor, exiton jump is more important than electron jump between orbitals, and exitons play a major role in optical transition and carrier transport. Two jump mechanisms more regularly take place in a π-orbital semiconductor—(1) electron jump into a conduction band from a valence band; and (2) exiton jump. Regarding electron jump into a conduction band from a valence band, after electrons absorb photons in a valence band, they jump from the valence band into a conduction band by energy obtained in absorption. That is, the conduction band is an excited state of electrons. Regarding exiton jump, after electrons absorb photons in a valence band, electron-hole pair formation is due to electron-hole binding resulted from Coulomb force between them. At this moment, the Coulomb force provides binding energy. This makes the electrons positioned in an excited state, but the excited state is below a conduction band, because the energy of the excited state is smaller than that of the conduction band. Consequently, the energy gap of exiton jump is smaller than that of electron jump into a conduction band from a valence band.

Some dopants can regulate the electric property of a traditional semiconductor, and can be used in production for a semiconductor device. However, when a π-orbital semiconductor is employed as a semiconductor material, it is desirable to select a proper ion or compound for regulating the electric property. Based on the structure and the characteristic of a π-orbital semiconductor, its dopant and doping process are different from those of a traditional semiconductor. A dopant for absorbing or integrating with the π-orbital semiconductor is usually a radiation absorbable metal complex. An intercalator, such as ethidium, means a cation with a planar aromatic hetero ring and it can be linked to an organic compound. Each intercalator can be inserted into a π-orbital semiconductor every 1.02 nm so as to jostle the molecules and reduce a radius of this compound. Another example of this compound which can be linked to the π-orbital semiconductor is $[Pt(terpy)(SCH_2CH_2OH)]^+$, $[Pt(bpy)(en)]^{2+}$, $[Pt(o\text{-}phen)(en)]^{2+}$, or $[Pt(py)_2(en)]^{2+}$.

Some planar metal complexes can be linked to an organic molecule, e.g. metalloporphyrin, MPE-Fe(II), or [Pt(AO-en)Cl$_2$]. These polycyclic compounds can be doped into a π-orbital semiconductor to regulate its electric property by a electrons and free electrons in transition metal cations. In another respect, a platinum compound, cisplatin, can be also used in a π-orbital semiconductor.

According to photoelectric effect of a π-orbital semiconductor, electrons can be emitted outwardly under a low bias. An experiment also shows that a π-orbital semiconductor can transform the energy carried by an α particle, a β particle, or a γ ray under a bias. The current density of the π-orbital semiconductor after this transformation is at least one million times as great as that of a traditional semiconductor. Compared with a traditional semiconductor, a π-orbital semiconductor is more sensitive to electric field change of a high energy particle, and therefore it is suitable for manufacture of a material which can absorb an energy carrier, i.e. an α particle, a β particle, or a γ particle, and convert each to electric energy.

SUMMARY OF THE INVENTION

An objective of the present invention is to provide a quantum cell to enhance nuclear energy to electric energy conversion efficiency of a prior nuclear battery.

For achieving the foregoing and/or other objective(s), the present invention provides a quantum cell from top to down including: an N-type ohmic contact electrode, an N-type π-orbital semiconductor substrate, an N-type π-orbital semiconductor epitaxy layer, a SiO$_2$ passivation layer, a graphite contact layer, a Schottky contact electrode, a binding layer, and a radioisotope layer. The N-type π-orbital semiconductor substrate includes an organic semiconductor material with an aromatic group or a semiconductor material with a carbon-carbon bond. The N-type π-orbital semiconductor epitaxy layer has a doping concentration of $1\times10^{13}$-$5\times10^{14}$ cm$^{-3}$ and is formed by injection of a cationic complex in a dose of $6\times10^{13}$-$1\times10^{15}$ cm$^{-3}$.

According to the present invention, the N-type π-orbital semiconductor substrate and the N-type π-orbital semiconductor epitaxy layer can lower the carrier concentration in the epitaxy layer, increase the width of a depletion region, and increase the collection efficiency for an electron-hole pair. As such, the open-circuit voltage and the conversion efficiency of the cell are enhanced. The quantum cell further has the following features:

1. Nuclear energy to electric energy conversion efficiency is of 10-30%.
2. A surface of the cell has a permissible radiation dose of less than 10 milliohm.
3. Gravimetric specific energy is approximately of 10-30 kWh/kg, and volumetric specific energy is approximately of 10-30 kWh/cm$^3$.
4. An operating life is of 5-100 years under normal operation.
5. An overall performance ratio is 50-1,000 times as great as that of a traditional lithium battery.

DETAILED DESCRIPTION OF THE INVENTION

The detailed description and preferred embodiments of the invention will be set forth in the following content, and provided for people skilled in the art so as to understand the characteristics of the invention.

Figure 1:
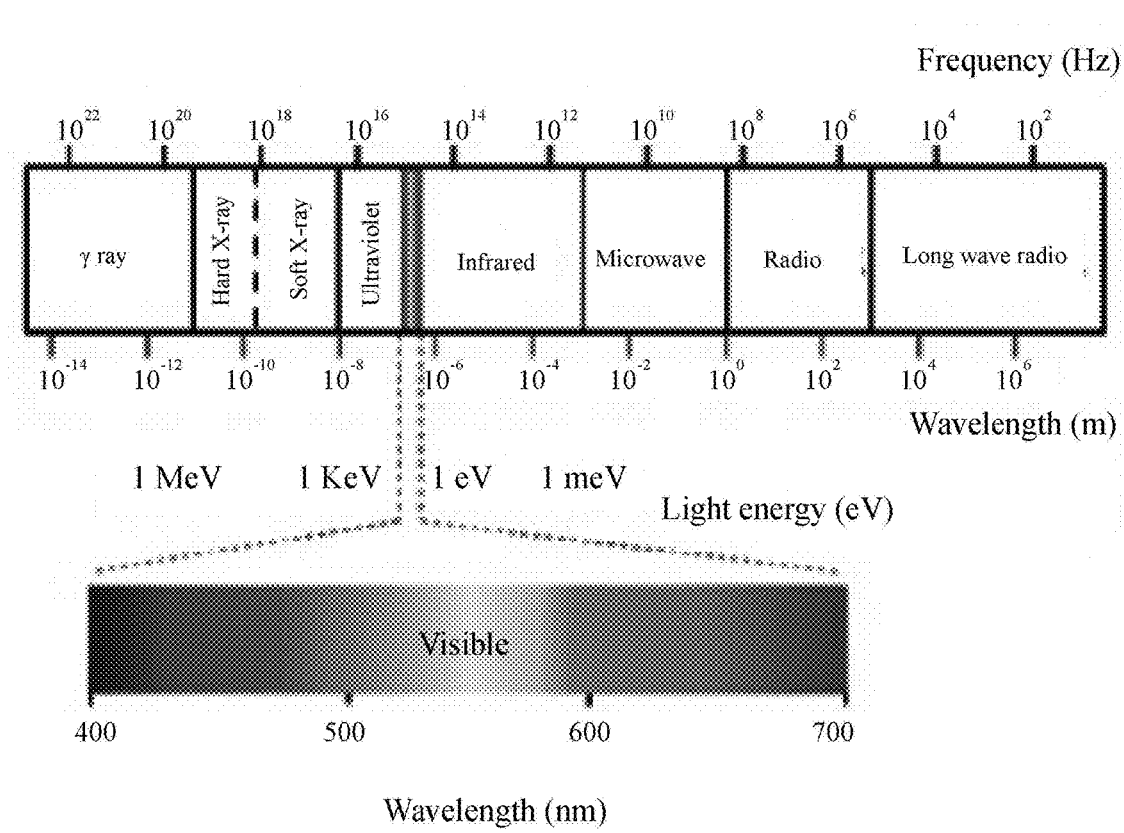
FIG. 1 shows the electromagnetic spectrum.
Figure 2:
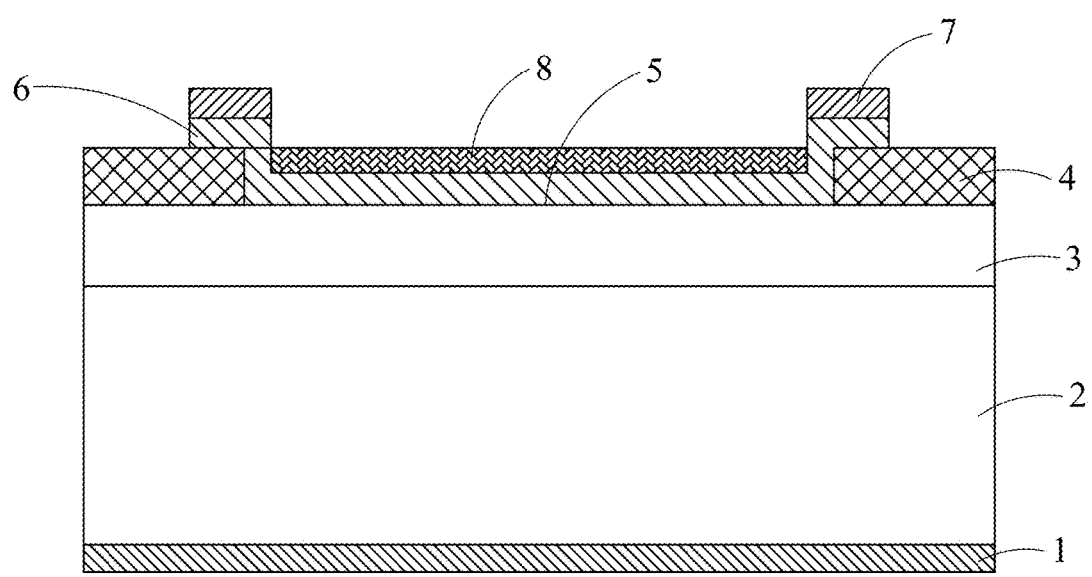
FIG. 2 is a schematic diagram illustrating a quantum cell according to an embodiment of the present invention.
Figure 3:
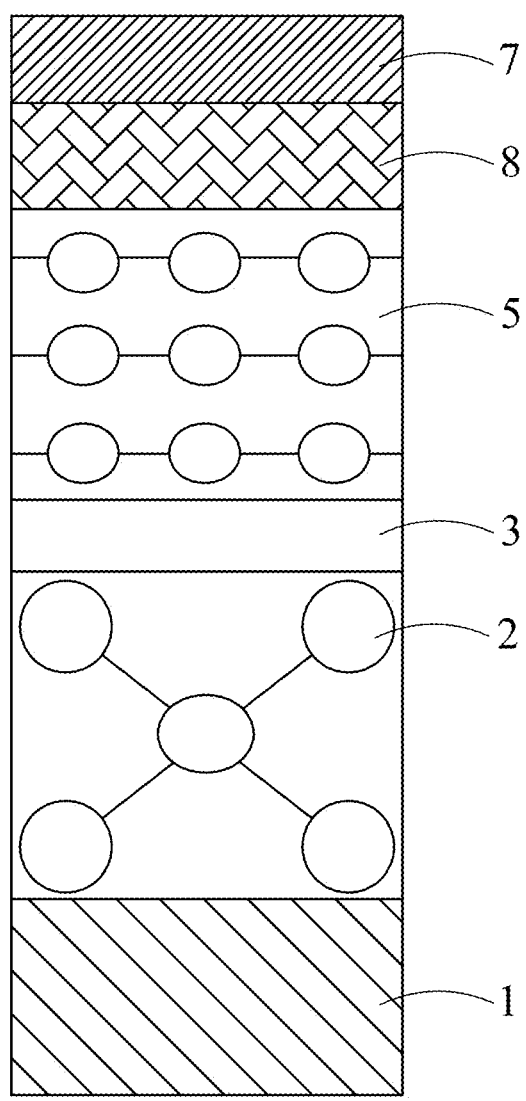
FIG. 3 is a sectional diagram illustrating the foregoing quantum cell.

Referring to FIGS. 2 and 3, a quantum cell is disclosed in an embodiment of the present invention, and the cell comprises: an N-type ohmic contact electrode (1), an N-type π-orbital semiconductor substrate (2), an N-type π-orbital semiconductor epitaxy layer (3), a SiO$_2$ passivation layer (4), a graphite contact layer (5), a Schottky contact electrode (6), a binding layer (7), and a radioisotope layer (8). The N-type π-orbital semiconductor substrate (2) includes an organic semiconductor material with an aromatic group or a semiconductor material with a carbon-carbon bond. The N-type π-orbital semiconductor epitaxy layer (3) has a doping concentration of $1\times10^{13}$-$5\times10^{14}$ cm$^{-3}$ and is formed by injection of a cationic complex in a dose of $6\times10^{13}$-$1\times10^{15}$ cm$^{-3}$.

The N-type π-orbital semiconductor substrate (2) is positioned on the N-type ohmic contact electrode (1), and has a doping concentration of $1\times10^{18}$-$7\times10^{18}$ cm$^{-3}$. In the embodiment, the N-type ohmic contact electrode (1) includes but not limited to a graphite material or a Ni—Cr—Au alloy.

The N-type π-orbital semiconductor epitaxy layer (3) is positioned on the N-type π-orbital semiconductor substrate (2), has the doping concentration of $1\times10^{13}$-$5\times10^{14}$ cm$^{-3}$, and is formed by injection of the cationic complex in a dose of $6\times10^{13}$-$1\times10^{15}$ cm$^{-3}$. In the embodiment, a thickness of the N-type π-orbital semiconductor epitaxy layer (3) is of but not limited to 3-5 μm.

The SiO$_2$ passivation layer (4) is positioned on a part of the N-type π-orbital semiconductor epitaxy layer (3).

The graphite contact layer (5) and the Schottky contact electrode (6) are positioned on another part of the N-type π-orbital semiconductor epitaxy layer (3). In the embodiment, the Schottky contact electrode (6) includes but not limited to Ni, Pt, or Au.

The binding layer (7) is positioned on the Schottky contact electrode (6). In the embodiment, the binding layer (7) includes but not limited to a Cr—Au alloy.

The radioisotope layer (8) is positioned on the graphite contact layer (5). In the embodiment, the radioisotope layer (8) includes but not limited to Ni-63, Pu-238, Cm-244, Cm-242, U-235, or U-238.

It is noted that the method for forming each upper layer on the corresponding lower layer is not within the scope of the present invention, and can be understood by people skilled in the art. The forming method can be practiced via a well-known technique, for example physical deposition, chemical deposition, coating, soaking, chemical replacement, or spraying, so there is no need for further recitation.

Based on the above mentioned structures, the deposition of the N-type π-orbital semiconductor substrate (2) and the N-type π-orbital semiconductor epitaxy layer (3) can lower the carrier concentration in the epitaxy layer, increase the width of a depletion region, and increase the collection efficiency for an electron-hole pair. In such a way, the open-circuit voltage and the conversion efficiency of the cell are enhanced.

With the above features, the cell of the embodiment further has the following features:

1. Nuclear energy to electric energy conversion efficiency is of 10-30%.
2. A surface of the cell has a permissible radiation dose of less than 10 milliohm.
3. Gravimetric specific energy is approximately of 10-30 kWh/kg, and volumetric specific energy is approximately of 10-30 kWh/cm$^3$.
4. An operating life is of 5-100 years under normal operation.
5. An overall performance ratio is 50-1,000 times as great as that of a traditional lithium battery.

While the invention has been described in connection with what is considered the most practical and preferred embodiments, it is understood that this invention is not limited to the disclosed embodiments but is intended to cover various arrangements included within the spirit and scope of the broadest interpretation so as to encompass all such modifications and equivalent arrangements.

What is claimed is:

1. A π-orbital semiconductor quantum cell from top to down comprising: an N-type ohmic contact electrode, an N-type π-orbital semiconductor substrate, an N-type π-orbital semiconductor epitaxy layer, a SiO$_2$ passivation layer, a graphite contact layer, a Schottky contact electrode, a binding layer, and a radioisotope layer;

wherein the N-type π-orbital semiconductor substrate includes an organic semiconductor material with an aromatic group or a semiconductor material with a carbon-carbon bond;

the N-type π-orbital semiconductor epitaxy layer has a doping concentration of $1\times10^{13}$-$5\times10^{14}$ cm$^{-3}$ and is formed by injection of a cationic complex in a dose of $6\times10^{13}$-$1\times10^{15}$ cm$^{-3}$.

2. The π-orbital semiconductor quantum cell as claimed in claim 1, wherein a thickness of the N-type π-orbital semiconductor epitaxy layer is of 3-5 μm.

3. The π-orbital semiconductor quantum cell as claimed in claim 1, wherein the radioisotope layer includes Ni-63, Pu-238, Cm-244, Cm-242, U-235, or U-238.

4. The π-orbital semiconductor quantum cell as claimed in claim 1, wherein the N-type ohmic contact electrode includes a graphite material.

5. The π-orbital semiconductor quantum cell as claimed in claim 1, wherein the Schottky contact electrode includes Ni, Pt, Au, or graphite.

* * * * *

UNITED STATES PATENT AND TRADEMARK OFFICE
CERTIFICATE OF CORRECTION

Page 1 of 1

PATENT NO. : 10,304,579 B2
APPLICATION NO. : 15/414698
DATED : May 28, 2019
INVENTOR(S) : Bor-Ruey Chen et al.

It is certified that error appears in the above-identified patent and that said Letters Patent is hereby corrected as shown below:

On the Title Page

"(71) Applicant: Bor-Ruey Chen, Taipei (TW)"
Should read:
-- (71) Applicants: Guokun Feng, Shenyang City (CN);
Bor-Ruey Chen, Taipei (TW) --

"(72) Inventor: Bor-Ruey Chen, Taipei (TW)"
Should read:
-- (72) Inventors: Guokun Feng, Shenyang City (CN);
Bor-Ruey Chen, Taipei (TW) --

Signed and Sealed this
Second Day of March, 2021

Drew Hirshfeld
*Performing the Functions and Duties of the*
*Under Secretary of Commerce for Intellectual Property and*
*Director of the United States Patent and Trademark Office*